United States Patent
Jeon

(10) Patent No.: US 7,612,318 B2
(45) Date of Patent: Nov. 3, 2009

(54) COMPLEMENTARY METAL OXIDE SEMICONDUCTOR IMAGE SENSOR HAVING CROSS TALK PREVENTION AND METHOD FOR FABRICATING THE SAME

(75) Inventor: In-Gyun Jeon, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 24 days.

(21) Appl. No.: 10/954,188

(22) Filed: Oct. 1, 2004

(65) Prior Publication Data
US 2005/0263676 A1  Dec. 1, 2005

(30) Foreign Application Priority Data
Oct. 1, 2003  (KR) ....................... 10-2003-0068503

(51) Int. Cl.
*H01L 27/00* (2006.01)
*H01J 3/14* (2006.01)
(52) U.S. Cl. .................... 250/208.1; 250/216
(58) Field of Classification Search .............. 250/208.1, 250/226, 552, 553, 559.04, 216; 348/294, 348/272, 273; 257/59, 72, 225, 230, 414, 257/428, 431, 432–437, 443, 445, 290–294, 257/222, 233, 231, 223, 440, 82–84; 438/48, 438/73, 75, 57, 60, 70, 65
See application file for complete search history.

(56) References Cited

U.S. PATENT DOCUMENTS 5,514,888 A * 5/1996 Sano et al. ................. 257/232
5,844,290 A * 12/1998 Furumiya ................... 257/432
6,057,538 A    5/2000 Clarke ....................... 250/208.1
6,211,509 B1 * 4/2001 Inoue et al. ............... 250/208.1
6,255,640 B1 * 7/2001 Endo et al. ................ 250/208.1
6,618,087 B1 * 9/2003 Hokari et al. .............. 348/311
6,639,293 B2   10/2003 Furumiya et al. .......... 257/462
6,806,904 B1 * 10/2004 Kim .......................... 348/315
6,821,810 B1 * 11/2004 Hsiao et al. ................ 438/69
6,903,391 B2 * 6/2005 Takeuchi et al. ........... 257/233
6,995,800 B2 * 2/2006 Takahashi et al. ......... 348/340
7,110,031 B2 * 9/2006 Kondo et al. .............. 348/315
7,154,549 B2 * 12/2006 Shizukuishi .............. 348/315
2001/0026322 A1 * 10/2001 Takahashi et al. ......... 348/340
2002/0153478 A1 * 10/2002 Hsin ........................ 250/227.14

FOREIGN PATENT DOCUMENTS

KR    10-1992-3536 A    2/1992

* cited by examiner

*Primary Examiner*—Georgia Y Epps
*Assistant Examiner*—Pascal M Bui-Pho
(74) *Attorney, Agent, or Firm*—Finnegan, Henderson, Farabow, Garrett & Dunner, L.L.P.

(57) ABSTRACT

Disclosed are a complementary metal oxide semiconductor (CMOS) image sensor and a method for fabricating the same, which are capable of effectively preventing a cross talk effect. The CMOS image sensor includes a semiconductor substrate; device isolation regions provided on the semiconductor for defining device regions therebetween; photocharge generating portions provided on the device regions for receiving external light and for generating and storing electric charges; light concentrating portions provided over the photocharge generating portions for concentrating the external light onto corresponding photocharge generating portions; and cross talk preventing portions for preventing the light passing through the light concentrating portions from being incident onto adjacent photocharge generating portions.

7 Claims, 3 Drawing Sheets

COMPLEMENTARY METAL OXIDE SEMICONDUCTOR IMAGE SENSOR HAVING CROSS TALK PREVENTION AND METHOD FOR FABRICATING THE SAME

RELATED APPLICATION

This application is related to and claims benefits of priority under 35 U.S.C. §119 to Korean Patent Application No. 10-2003-0068503, filed on Oct. 1, 2003, entitled "CMOS IMAGE SENSOR AND FABRICATION METHOD THEREOF," the entire contents of which are expressly incorporated herein by reference.

BACKGROUND (a) Technical Field

The present invention relates to a complementary metal oxide semiconductor (CMOS) image sensor and a method for fabricating the same, and, more particularly, to a complementary metal oxide semiconductor (CMOS) image sensor capable of effectively preventing a cross talk effect and a method for fabricating the same.

(b) Description of the Related Art

In general, semiconductor image sensors are semiconductor devices for converting an optical image into electrical signals and may be a charge coupled device (CCD) image sensor or a CMOS image sensor. Research efforts have been made to increase photosensitivity of the image sensors and a light concentration technique has been introduced.

For example, a CMOS image sensor comprises a photo-detecting element for sensing light and a logic circuit for converting sensed light into electrical signals. The photo-detecting element typically includes a photodiode. For fabrication of a CMOS image sensor, a ratio of the area of the photo-detecting element to the entire area of the CMOS image sensor (referred to as "full factor" typically) has to be increased in order to increase the photosensitivity.

However, the full factor is limited to the extent that the logic circuit also has to be formed within the area of the CMOS image sensor.

Many light concentration techniques have been studied which change the path of light incident on regions of the CMOS image sensor other than on the photo-detecting element. One example of such light concentration techniques is a technique of forming a micro lens on an upper portion of a color filter of the CMOS image sensor, which may be described with reference to FIG. 1.

In FIG. 1, a conventional CMOS image sensor includes a semiconductor substrate 100, device isolation regions 102 on the semiconductor substrate 100 for isolating one device from another device, CMOS devices 106 including photodiodes 104 in device regions between device isolation regions 102, a wire-insulating layer 108 on both device isolation regions 102 and CMOS devices 106, and a first metal wire M1 on wire-insulating layer 108, wherein the first metal wire M1 passes through wire-insulating layer 108 and provides contact to CMOS devices 106.

In addition, the CMOS image sensor further includes a first inter-wire-insulating layer 110, a second metal wire M2, a second inter-wire-insulating layer 112, a third metal wire M3, and a third inter-wire-insulating layer 114, which are sequentially layered on the wire-insulating layer 108 as shown in FIG. 1.

Also, the CMOS image sensor further includes color filters R, G, and B, a planarizing layer 116, and micro lenses 118, which are sequentially layered on the third inter-wire-insulating layer 114.

With such a structure of the CMOS image sensor, external light A, B, C, and D are concentrated on the photodiodes 104 of the CMOS devices 106 after passing through the micro lenses 118. However, part of the light, such as light beams A and D, incident on edges of micro lenses 118 are significantly refracted and may be incident not on a CMOS device of a corresponding pixel, but on CMOS devices of adjacent pixels.

Such a phenomenon that light passing through the micro lenses 118 is incident on the CMOS devices of adjacent pixels, referred to as "cross talk," produces unnecessary noise components, thereby deteriorating characteristics of the CMOS image sensor.

U.S. Pat. Nos. 6,057,538 and 6,639,293 disclose image sensors which reduces the cross talk. However, the image sensors disclosed in these patents have restrictions on effective avoidance of the cross talk.

SUMMARY

In considerations of the above problem, it is an aspect of the present invention to provide a CMOS image sensor for effectively minimizing cross talk. It is another aspect of the present invention to provide a method for fabricating a CMOS image sensor for effectively minimizing cross talk.

Consistent with the present invention, there is provided a CMOS image sensor including a semiconductor substrate; device isolation regions provided on the semiconductor for defining device regions therebetween; photocharge generating portions provided on the device regions for receiving external light and for generating and storing electric charges; light concentrating portions provided over the photocharge generating portions for concentrating the external light onto corresponding photocharge generating portions; and cross talk preventing portions for preventing the light passing through the light concentrating portions from being incident onto adjacent photocharge generating portions.

Consistent with the present invention, there is also provided a method for fabricating a CMOS image sensor including forming device isolation regions and photocharge generating portions on a semiconductor substrate; forming cross talk preventing portions over the photocharge generating portions; and forming light concentrating portions over the semiconductor substrate.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of the specification, illustrate an embodiment of the invention, and, together with the description, serve to explain the principles of the invention. In the drawings.

DETAILED DESCRIPTION

Reference will now be made in detail to exemplary embodiments of the invention, examples of which are illustrated in the accompanying drawings. Wherever possible, the same reference numbers will be used throughout the drawings to refer to the same or like parts.

An embodiment of the present invention will now be described in detail with reference to the accompanying drawings.

Figure 1:
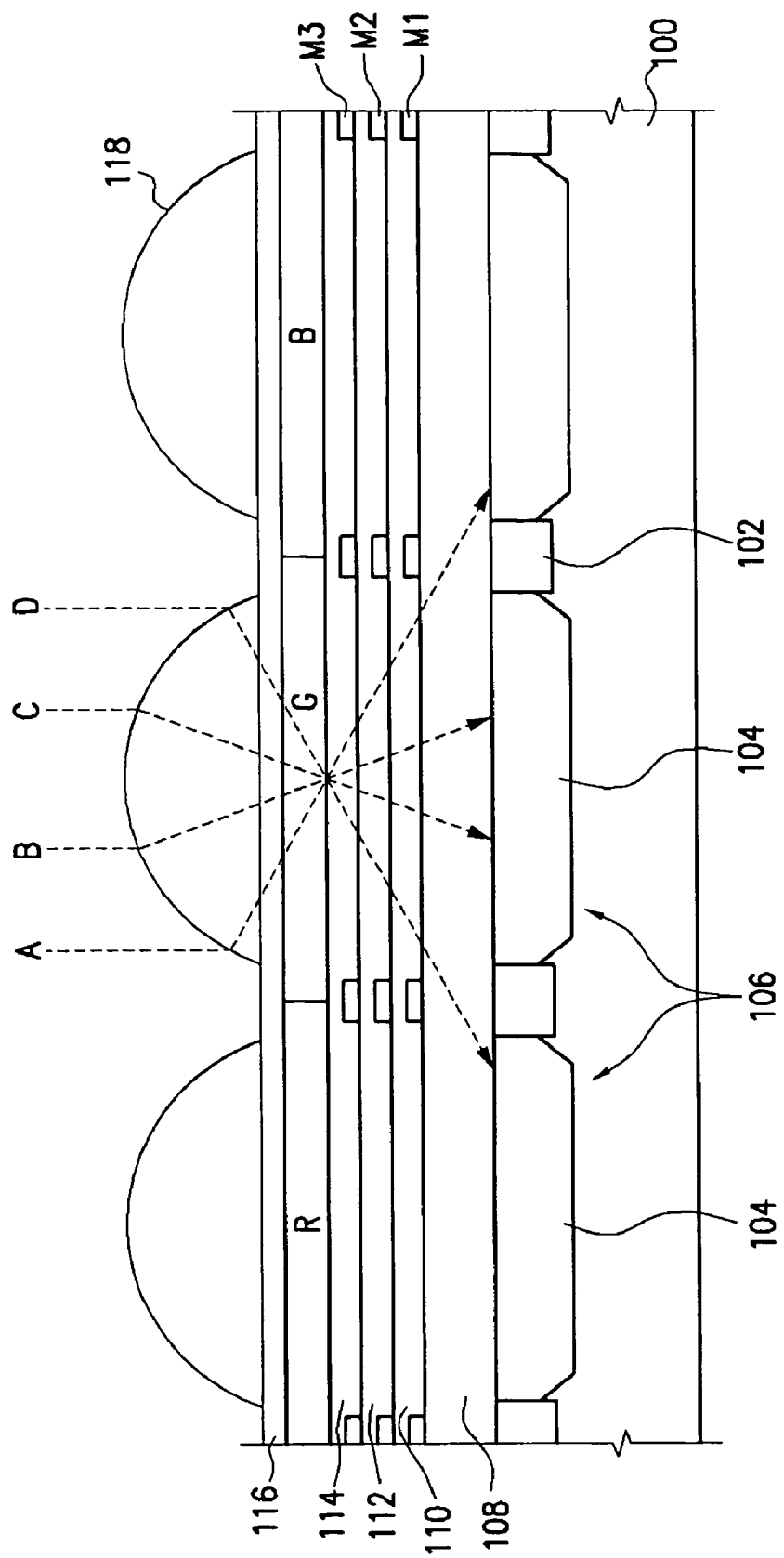
FIG. 1 is a cross-sectional view of a conventional CMOS image sensor.
Figure 2:
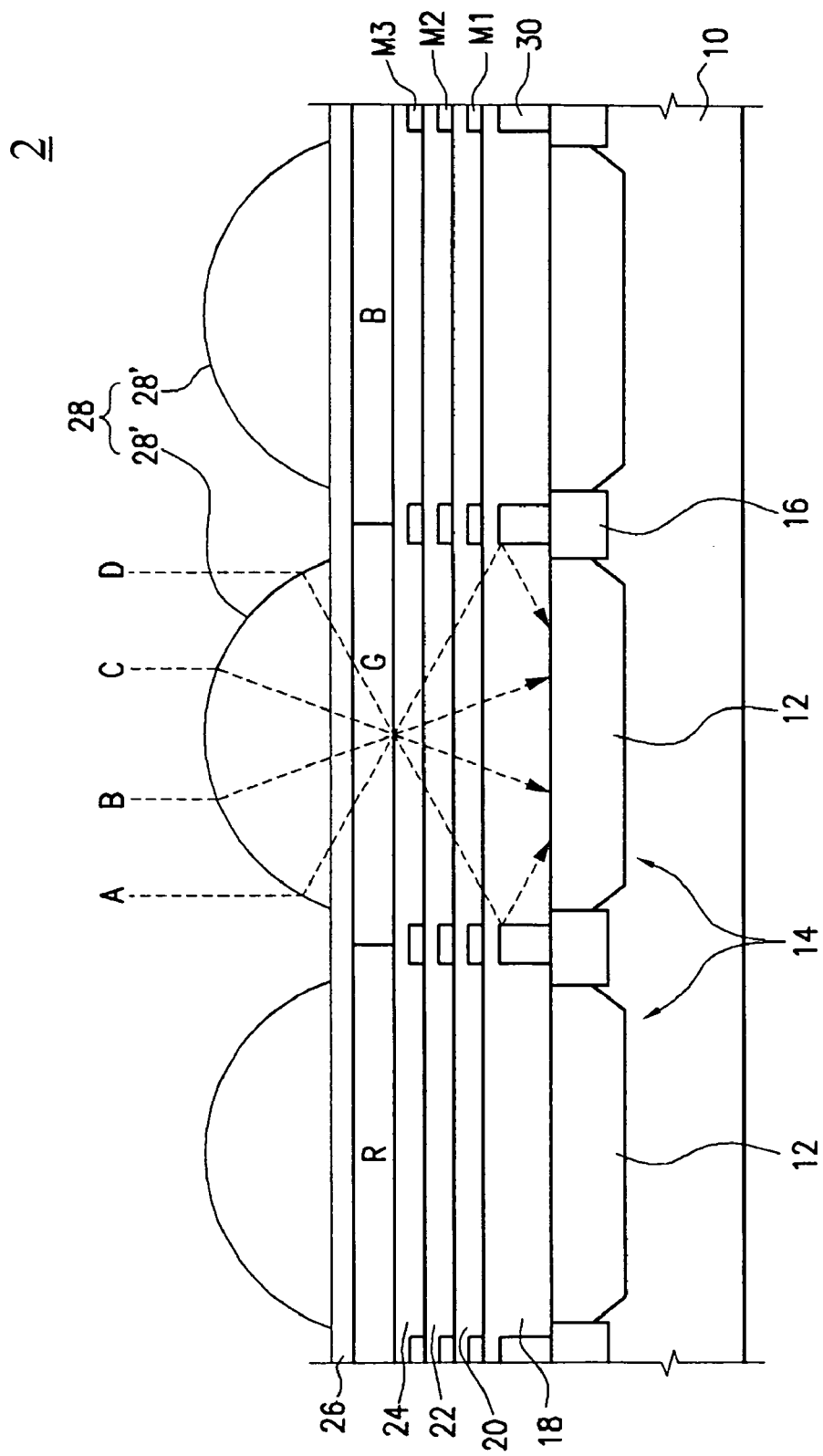
FIG. 2 is a cross-sectional view of a CMOS image sensor consistent with an embodiment of the present invention.

FIG. 2 is a schematic sectional view illustrating a CMOS image sensor 2 consistent with an embodiment of the present invention.

Referring to FIG. 2, CMOS image sensor 2 includes a semiconductor substrate 10 on which CMOS devices 14 are formed. CMOS devices 14 include photocharge generating portions 12 for receiving light externally and for generating and accumulating charges. In one aspect, photocharge generating portions 12 comprise photodiodes each formed as an impurity junction layer, with one photodiode provided per pixel.

In addition, CMOS devices 14 are formed in a plurality of device regions defined by device isolation regions 16 provided on semiconductor substrate 10 and are isolated from one another by device isolation regions 16. Each device isolation region 16 may comprise a shallow trench isolation (STI) film or a field oxide film.

A wire-insulating layer 18 is formed on the structure including CMOS devices 14 and the device isolation regions 16. First metal wires M1 are formed on and through wire-insulating layer 18 to provide contacts to CMOS devices 14.

A first inter-wire-insulating layer 20, second metal wires M2, a second inter-wire-insulating layer 22, third metal wires M3, and a third inter-wire-insulating layer 24 are sequentially layered on the wire-insulating layer 18 as shown in FIG. 2.

Also, color filters R, G and B, a planarizing layer 26, and micro lenses 28 are sequentially layered on third inter-wire-insulating layer 24. In one aspect, micro lenses 28 are provided such that each micro lens 28 corresponds to a respective one of CMOS devices 14 and concentrates external light onto a corresponding one of photodiodes 12.

Referring again to FIG. 2 and consistent with an embodiment of the present invention, a reflecting layer 30 is formed on each of device isolation regions 16 as a cross talk preventer for preventing light passing through the micro lenses from being incident on adjacent CMOS devices.

In one aspect, reflecting layer 30 comprises a metal or non-transparent organic material having good depositability and electrical conductivity.

Figure 3:
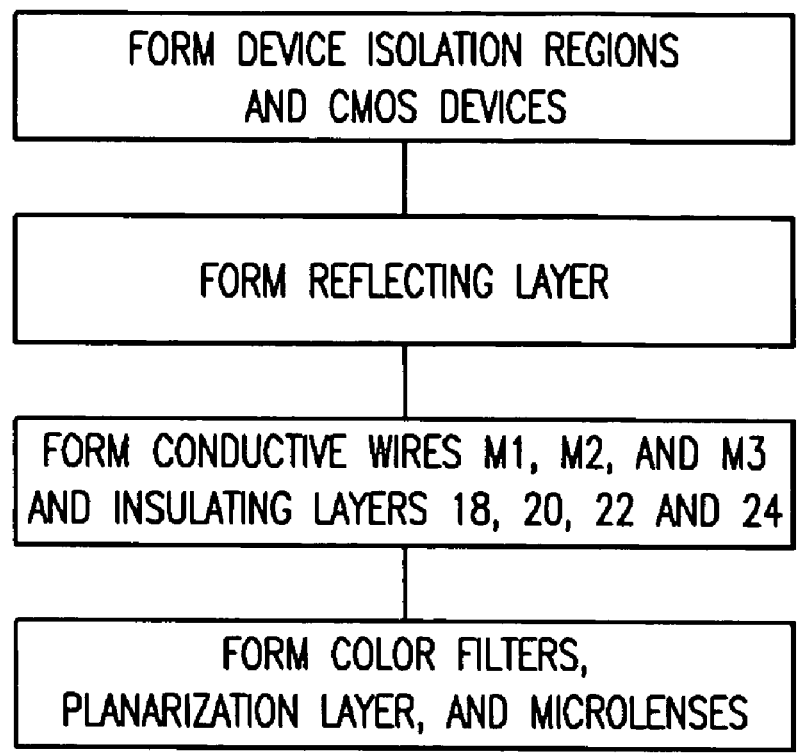
FIG. 3 is a flow chart illustrating a method for fabricating a CMOS image sensor consistent with an embodiment of the present invention.

FIG. 3 is a flow chart illustrating a method for forming CMOS image sensor 2 consistent with an embodiment of the present invention. As shown in FIG. 3, CMOS image sensor 2 may be fabricated by a method including forming device isolation regions 16 and CMOS devices 14 on the semiconductor substrate 10, and forming reflecting layer 30 by depositing or coating a metal or non-transparent organic material on the structure where CMOS devices 14 are formed. In one aspect, the method also includes forming, above device isolation regions 16, metal wire insulation layer 18, first metal wire M1, first inter-wire-insulating layer 20, second metal wire M2, second inter-wire-insulating layer 22, third metal wire M3, and third inter-wire-insulating layer 24 on the resultant structure. Finally, the method includes forming the color filters R, G and B, the planarizing layer 26, and the micro lenses 28 on the third inter-wire-insulating layer 24.

CMOS image sensors consistent with the present invention can effectively prevent cross-talk. For example, referring back to FIG. 2, when external light rays A, B, C, and D are concentrated on photodiodes 12 of CMOS devices 14 after passing through micro lenses 28, portions of the light incident on edges of micro lenses 28, such as light beams A and D, are significantly refracted. Instead of reaching adjacent photodiodes, as in the prior art, the refracted light rays A and D are reflected by reflecting layer 30 and are incident on a photodiode 12 of the corresponding CMOS device 14. Therefore, the cross talk can be minimized, resulting in satisfactory characteristics of image sensor 2.

Consistent with the present invention, reflecting layers may also be formed on the insulating layers 20, 22, and/or 24.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A CMOS image sensor, comprising:
a semiconductor substrate;
device isolation regions provided on the semiconductor substrate for defining device regions therebetween;
photocharge generating portions provided on the device regions for receiving external light and for generating and storing electric charges, wherein the photocharge generating portions are enclosed by the device isolation regions;
light concentrating portions provided over the photocharge generating portions for concentrating the external light onto corresponding photocharge generating portions;
first non-transparent organic material cross talk preventing portions for preventing the light passing through the light concentrating portions from being incident onto adjacent photocharge generating portions, wherein the first cross talk preventing portions consist of reflecting layers of a deposited conductive non-transparent organic material and are immediately adjacent to the device isolation regions;
a first insulating layer covering the first cross talk preventing portions;
a plurality of color filters, conductive wires, and second insulating layers provided under the light concentrating portions; and
second non-transparent organic material cross talk preventing portions formed on one of the second insulating layers.

2. The CMOS image sensor of claim 1, wherein the photocharge generating portions comprise photodiodes each formed as an impurity junction layer.

3. The CMOS image sensor of claim 2, wherein the light concentrating portions comprise micro lenses each corresponding to one of the photodiodes.

4. The CMOS image sensor of claim 3, wherein the device isolation regions comprise trench oxide films or field oxide films.

5. The CMOS image sensor of claim 1, wherein the non-transparent organic material of the first cross talk preventing portions and the second cross talk preventing portions has electrical conductivity.

6. A method for fabricating a CMOS image sensor, comprising:
   forming device isolation regions and photocharge generating portions on a semiconductor substrate;
   depositing first cross talk preventing portions on the device isolation regions to form reflecting layers, such that the first cross talk preventing portions are immediately adjacent to the device isolation regions, and wherein the first cross talk preventing portions consist of a conductive non-transparent organic material;
   forming an insulating layer on the whole surface of the substrate in order to completely cover the first cross talk preventing portions after the formation of the first cross talk preventing portions;
   forming light concentrating portions over the insulating layer;
   forming at least one layer of conductive wires and at least one layer of insulating materials on the insulating layer;
   depositing second cross talk preventing portions of a conductive non-transparent organic material on the at least one layer of insulating materials on the insulating layer; and
   forming color filters over the at least one layer of insulating materials.

7. The method of claim 6, wherein the non-transparent organic material of the first cross talk preventing portions and the second cross talk preventing portions has electrical conductivity.

* * * * *